United States Patent [19]

Glashauser et al.

[11] 4,393,129

[45] Jul. 12, 1983

[54] METHOD OF STRESS-FREE DEVELOPMENT OF IRRADIATED POLYMETHYLMETACRYLATE

[75] Inventors: Walter Glashauser, Munich; Grigore-Vlad Ghica, Ebenhausen, both of Fed. Rep. of Germany

[73] Assignee: Siemens Aktiengesellschaft, Berlin & Munich

[21] Appl. No.: 303,094

[22] Filed: Sep. 17, 1981

[30] Foreign Application Priority Data

Oct. 16, 1980 [DE] Fed. Rep. of Germany ........ 3039110

[51] Int. Cl.³ .............................................. G03C 5/30
[52] U.S. Cl. ..................................... 430/296; 430/309; 430/326; 430/331; 430/942; 430/966
[58] Field of Search ............... 427/43.1; 430/296, 309, 430/325, 326, 331, 942, 966

[56] References Cited

U.S. PATENT DOCUMENTS 3,255,004  6/1966  Thommes ............................ 430/331
3,475,171  10/1969  Alles .................................... 430/331
4,055,515  10/1977  Kirch ................................... 430/331
4,130,425  12/1978  Boyd ................................... 430/331
4,267,260  5/1981  Miura et al. ......................... 430/331
4,302,529  11/1981  Lai ....................................... 430/296

*Primary Examiner*—Mary F. Downey
*Attorney, Agent, or Firm*—Hill, Van Santen, Steadman, Chiara & Simpson

[57] ABSTRACT

Stress and crack-free development of resist layers or films, for example composed of PMMA, used in production of galvanically generated flat precision parts is achieved. Resist layers having a thickness of at least 100 μm are exposed via electron lithography or x-ray lithography techniques whereby very fine structure patterns having dimensions in the micron and sub-micron range are attained and developed with a developer comprised of a mixture of a material selected from the glycol ether group, a material selected from the primary amine group, a material selected from the aqueous group and a material selected from the azine group. Aspect ratios of 30:1 are achieved without dark errosion. Residual PMMA components remaining after development, as well as the developer itself, are fully removed with a post-development rinsing with water so that no disruptive layer residues remain on the surface which has been uncovered through development.

5 Claims, No Drawings

METHOD OF STRESS-FREE DEVELOPMENT OF IRRADIATED POLYMETHYLMETACRYLATE

BACKGROUND OF THE INVENTION

1. Field of the Invention

The invention relates to methods of generating structures via photo-resist techniques and somewhat more particularly to a method of generating non-crazed structures in x-ray or electron-beam sensitive resist layers so as to achieve very high aspect ratios after proper irradiation and development.

2. Prior Art

Very fine structures having dimensions in the micron and sub-micron range are required in the manufacture of integrated circuits and components for surface wave and microwave applications. Reproduction techniques, such as electron lithography or x-ray lithography, are particularly interesting for generating such structures because they function with significantly shorter wave lengths than does traditional photo lithography and, thus, provide better resolution. Characteristic for such techniques of electron or x-ray lithography are resist masking layer thicknesses up to approximately 3 $\mu$m. Such relatively thin layer thicknesses typically suffice for subsequent work steps, such as etching, vapor-deposition, etc.

A further possible use of electron or x-ray lithography is in galvanic generation of flat metal structures having extremely fine structural dimensions. In this usage, the masking layers, which laterally limit the galvanically precipitated metal, must have a somewhat greater thickness than the molded plastic part. It is the goal of this technique, with the thickest possible masking or cover layer (greater than 100 $\mu$m) to achieve vertical edges at those segments which have been uncovered through development, given the smallest possible structural dimensions.

One of the principle difficulties in industrial application of x-ray lithography for generating galvanically precipitated flat surface structures or parts is the production of stress and crack-free cover or masking layers. With the use of a PMMA (polymethylmethacrylate-which is a preferred material used in x-ray lithography) resist as the cover layer, tests have shown that stress cracks already appear in layers after development begins with a PMMA layer thickness of about 3 $\mu$m.

A further difficulty of a more general nature is that the non-irradiated areas of a PMMA layer are also partially erroded or dissolved during development (i.e. are subject to dark errosion). This causes a reduction in structural resolution and thus to a diminution of the aspect ratio (i.e. ratio of width to height).

SUMMARY OF THE INVENTION

The invention provides a method of generating a very high aspect ratio in x-ray-sensitive or electron beam-sensitive resist layers or films, particularly composed of a PMMA material, while avoiding stress cracks.

In accordance with the principles of the invention, a relatively thick irradiated resist layer is developed with a developer comprises of a mixture of components. This developer comprises a mixture of a material selected from the glycol ether group, for example, ethylene glycol monobutyl either or di-ethylene glycol monobutyl ether, a material selected from the primary amine group, for example, monoethanol amine, an aqueous material, for example water, and a material selected from the azine group, for example, tetrahydro-1, 4-oxazine.

With the inventive developer, crack-free structures can be generated with an extremely high aspect ratio. Even with long development time periods, for example, 16 hours, no errosion (dark errosion) of the non-irradiated resist material occurss. Presuming proper irradiation or exposure, a development period of only approximately 20 minutes is required for a 100 $\mu$m thick PMMA layer.

A further advantage of the inventive developer is the residue-free removability of any loosened PMMA components by vigorous rinsing, for example, with water. The mechanical properties of a PMMA layer are influenced with the inventive developer, during development, in such a manner that stress cracks or stress crazing no longer occur.

DESCRIPTION OF THE PREFERRED EMBODIMENTS

The invention provides a method for generating stress-free structures in x-ray or electron-beam sensitive resist layers or films, for example, based on a PMMA material, whereby very high aspect ratios are readily attained after proper irradiation or exposure and development.

In accordance with the principles of the invention, development of a properly irradiated resist layer occurs with a developer comprised of a mixture of a material selected from the glycol ether group, a material selected from the primary amine group, an aqueous material, and a material selected from the azine group.

In an exemplary embodiment of the invention, materials from the glycol ether group can be, for example, ethylene glycol monobutyl ether or diethylene glycol monobutyl ether; materials from the primary amine group can be, for example, monoethanol amine; the aqueous material can be, for example, water; and the material from the azine group can be, for example, tetrahydro-1, 4-oxazine.

A present preferred exemplary embodiment of the inventive developer consists of about 50 through 70 volume percent of ethylene glycol monobutyl ether or diethylene glycol monobutyl ether; 1 through 20 volume percent of monoethanol amine, up to 20 volume percent of water, and 5 through 20 volume percent of tetrahydro-1, 4-oxazine.

In certain embodiments of the invention, development occurs at control temperatures. Preferably, a development temperature ranging between about 20° and 50° C. is utilized. The mechanical properties of a PMMA layer can be influenced in an intentional manner by proper selection of a development temperature.

The principles of the invention are applicable both for immersion and spraying development techniques. A particular advantage of the invention is that the developer utilized is water-soluble so that no residues of developed resist parts remain on the observed (uncovered) substrate when it is rinsed with water.

In the manufacture of matrixes or patterns for galvanoplastic structures, an aspect ratio of 30:1 was achieved in 100 $\mu$m thick PMMA layers with the inventive developer without dark errosion being observed.

As is apparent from the foregoing specification, the present invention is susceptible of being embodied with various alternations and modifications which may differ particularly from those that have been described from the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A method of generating stress-free structures in x-ray sensitive or electron beam-sensitive resist layers or films comprising polymethylmethacrylate material so as to achieve a very high aspect ratio after proper irradiation; comprising irradiating a select pattern of x-rays or electron beams onto a relatively thick resist layer comprising said polymethylmethacrylate material; and developing said exposed resist layer with a developer composed of a mixture of a material selected from the glycol ether group, a material selected from the primary amine group, a material selected from the aqueous group, and a material selected from the azine group.

2. A method as defined in claim 1 wherein the material selected from the glycol group is ethylene glycol monobutyl ether or diethylene glycol monobutyl ether; the material selected from the primary amine group is monoethanol amine; the material selected from the aqueous group is water, and the material selected from the azine group is tetrahydro-1, 4-oxazine.

3. A method as defined in claim 1 wherein said developer is comprised of 50 through 70 volume percent of a material selected from the glycol ether group; 1 through 20 volume percent of a material selected from the primary amine group, up to 20 volume percent of a material selected from the aqueous group; and 5 through 20 volume percent of a material selected from the azine group.

4. A method as defined in claim 1 wherein development occurs at a temperature ranging between about 20° and 50° C.

5. A method as defined in claim 1 wherein said resist layer is composed of polymethylmethacrylate and has a thickness of at least about 100 μm.

* * * * *